(12) United States Patent
Yu

(10) Patent No.: US 6,432,784 B1
(45) Date of Patent: Aug. 13, 2002

(54) METHOD OF FORMING L-SHAPED NITRIDE SPACERS

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/804,162

(22) Filed: Mar. 12, 2001

(51) Int. Cl.[7] .................. H01L 21/336; H01L 21/3205; H01L 21/4763; H01L 21/31
(52) U.S. Cl. .................. 438/303; 438/595; 438/763
(58) Field of Search .................. 438/231, 301, 438/303, 305, 372, 424, 439, 595, 763

(56) References Cited

U.S. PATENT DOCUMENTS 5,770,508 A * 6/1998 Yeh et al. .................. 438/305
6,156,598 A * 12/2000 Zhou et al. .................. 438/231
6,235,597 B1 * 5/2001 Miles .................. 438/301
6,294,480 B1 * 9/2001 Pradeep et al. .................. 438/763

* cited by examiner

*Primary Examiner*—John F. Niebling
*Assistant Examiner*—Walter L. Lindsay, Jr.
(74) *Attorney, Agent, or Firm*—Foley & Lardner

(57) ABSTRACT

The disclosure includes an exemplary embodiment which relates to a method of forming L-shaped spacers in an integrated circuit. This method can include providing a gate structure over a semiconductor substrate, depositing a spacer material adjacent lateral sides of the gate structure, forming dummy oxide spacer structures over the spacer material where the dummy oxide spacer structures are shaped to selectively cover an L-shaped portion of the spacer material, removing portions of the spacer material not covered by the dummy oxide spacer structures, and removing the dummy oxide spacer structures.

20 Claims, 2 Drawing Sheets

METHOD OF FORMING L-SHAPED NITRIDE SPACERS

FIELD OF THE INVENTION

The present specification relates to integrated circuits and to methods of manufacturing integrated circuits. More particularly, the present specification relates to a method of forming L-shaped nitride spacers in an integrated circuit.

BACKGROUND OF THE INVENTION

Transistors are generally formed on the top surface of a semiconductor substrate. Typically, the semiconductor substrate is divided into a number of active and isolation regions through an isolation process, such as, field oxidation or shallow trench isolation. A thin oxide is grown on an upper surface of the semiconductor substrate in the active regions. The thin oxide serves as the gate oxide for subsequently formed transistors.

Polysilicon gate conductors are formed in the active regions above the thin oxide. The gate conductor and thin oxide form a gate structure which traverses each active region, effectively dividing the active region into two regions referred to as a source region and. a drain region. After formation of the polysilicon gates, an implant is performed to introduce an impurity distribution into the source/drain regions. Generally, source/drain regions are heavily doped with n-type or p-type dopants.

Often a source extension and drain extension are disposed partially underneath the gate structure to enhance transistor performance. Source and drain extensions are extensions of the source and drain regions. Shallow source and drain extensions help to achieve immunity to short-channel effects which degrade transistor performance for both n-channel and p-channel transistors. Short-channel effects can cause threshold voltage roll-off and drain-inducted barrier-lowering.

Spacers are structures which abut lateral sides of the gate structure and are provided over source and drain extensions. Preferably, spacers are silicon dioxide ($SiO_2$) structures. Alternatively, other spacer materials, such as, silicon nitride ($Si_3N_4$), silicon oxynitride (SiON), or other insulators can be used. Conventional spacer formation tends to have a rounded shape in cross-section. Traditionally, metal oxide semiconductor (MOS) field effect transistors (FETs) utilize a D-shaped spacer, a triangle shaped oxide spacer, or a trapezoid shaped nitride spacer. The spacer helps to separate the shallow source and drain extensions from the deep source and drain contact junctions. With a different shape of the conventional spacer, it is possible to improve design flexibility and improve device manufacturability.

Thus, there is a need for a method of forming L-shaped nitride spacers. Further, there is a need for an additional buffer to the source and drain extension that makes the best tradeoff between series resistance and short-channel effect. Even further, there is a need for increased possibilities in integrated circuit device design.

SUMMARY OF THE INVENTION

An exemplary embodiment relates to a method of forming L-shaped spacers in an integrated circuit. This method can include providing a gate structure over a semiconductor substrate, depositing a spacer material adjacent lateral sides of the gate structure, forming dummy oxide spacer structures over the spacer material where the dummy oxide spacer structures are shaped to selectively cover an L-shaped portion of the spacer material, removing portions of the spacer material not covered by the dummy oxide spacer structures, and removing the dummy oxide spacer structures.

Another embodiment relates to a method of forming cross-sectionally L-shaped spacers in an integrated circuit. This method can include forming a gate structure on a substrate, depositing a liner oxide layer over the substrate and the gate structure, depositing a nitride layer over the liner oxide layer, forming dummy oxide spacer structures over the nitride layer where the nitride layer is located proximate lateral side walls of the gate structure, and removing portions of the nitride layer and liner oxide layer not covered by the dummy oxide spacer structures.

Another embodiment relates to a method of fabricating an integrated circuit. This method can include depositing a layer of spacer material over a semiconductor substrate and a gate structure disposed over the semiconductor substrate, providing dummy spacer structures over first portions of the layer of spacer material, removing second portions of the layer of spacer material, and removing the dummy spacer structures. The first portions of the layer of spacer material are L-shaped and are located proximate lateral side walls of the gate structure. The second portions of the layer of spacer materials are uncovered by the dummy spacer structures.

Other features and advantages of embodiments of the present invention will become apparent to those skilled in the art upon review of the following drawings, the detailed description, and the appended claims.

BRIEF DESCRIPTION OF THE DRAWINGS

The invention is illustrated by way of example and not limitation in the FIGURES of the accompanying drawings, in which like references indicate similar elements and in which.

DETAILED DESCRIPTION OF THE EXEMPLARY EMBODIMENTS

Figure 1:
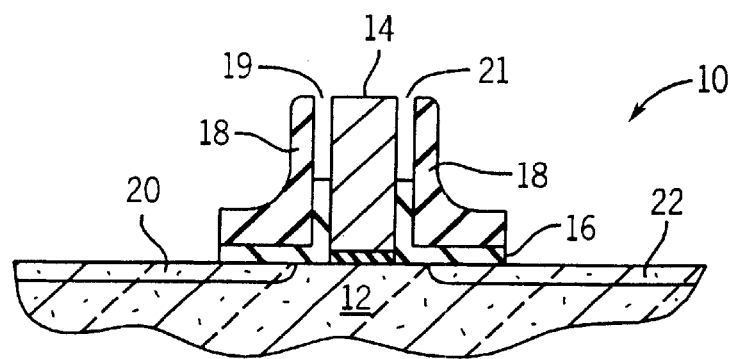
FIG. 1 is a schematic cross-sectional view representation of a portion of an integrated circuit in accordance with an exemplary embodiment.

Referring to FIG. 1, a cross-sectional view schematic of a portion 10 of an integrated circuit (IC) is illustrated in accordance with an exemplary embodiment. Portion 10 can include a substrate 12, a gate structure 14, an oxide liner 16, L-shaped spacers 18, a source region 20, and a drain region 22. Portion 10 includes several transistors, such as, metal oxide semiconductor (MOSFET) devices. Portion 10 is manufactured as part of the IC on a semiconductor wafer, such as, a silicon wafer.

Substrate 12 is any of a variety of semiconductor materials. In an exemplary embodiment, substrate 12 is silicon. Gate structure 14 is any of a variety of conductive materials. In an exemplary embodiment, gate structure 14 includes polysilicon. Gate structure 14 is aligned between active regions in substrate 12 (source region 20 and drain region 22). Active regions are areas in portion 10 including impurities or dopants, such as, a p-type dopant (e.g., boron) or an n-type dopant (e.g., phosphorus).

Figure 4:
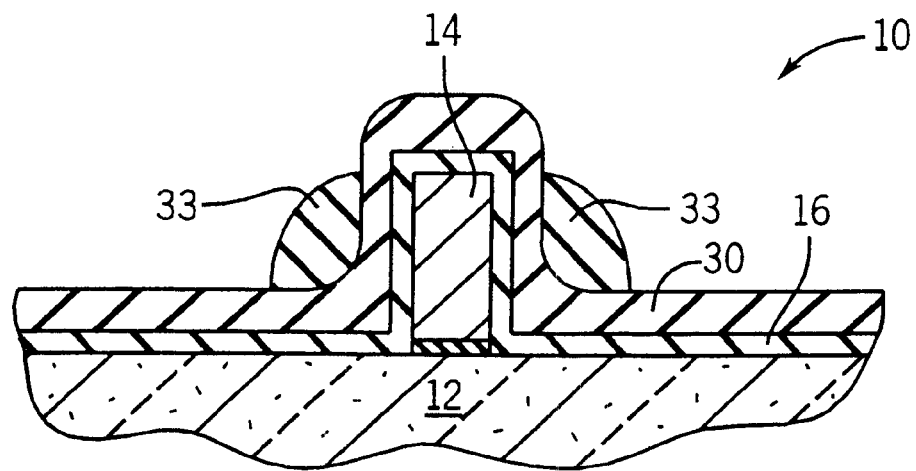
FIG. 4 is a schematic cross-sectional view representation of the portion of an integrated circuit of FIG. 1, illustrating a dummy oxide spacer formation step in the integrated circuit fabrication process.
Figure 5:
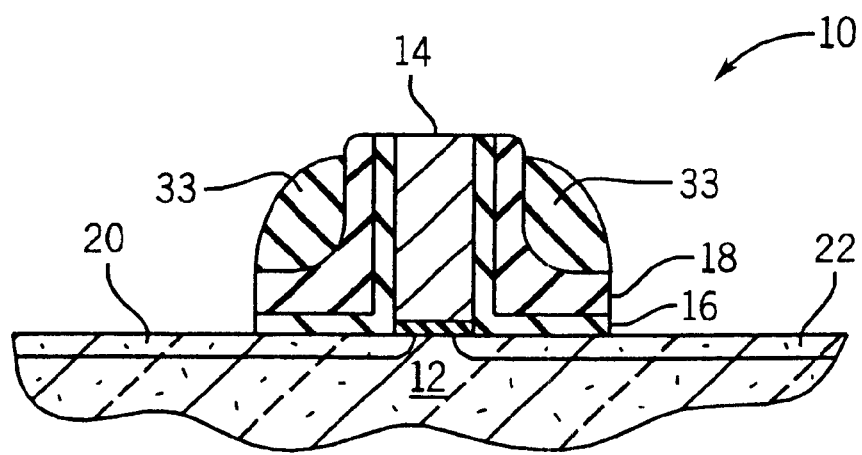
FIG. 5 is a schematic cross-sectional view representation of a portion of an integrated circuit of FIG. 1, illustrating a nitride etching step in the integrated circuit fabrication process.

Oxide liner 16 can be an oxide material and, in an exemplary embodiment, has a thickness of 100–200 Angstroms. Oxide liner 16 is located between L-shaped spacers 18 and gate structure 14 as well as between L-shaped spacers 18 and substrate 12. In an exemplary embodiment, portion 10 includes gaps 19 and 21 located between gate structure 14 and L-shaped spacers 18. Gaps 19 and 21 are created when dummy spacers described with reference to FIGS. 4 and 5 are removed. Gaps 19 and 21 are substantially similar in depth to the height to these dummy spacers. Advantageously, gaps 19 and 21 can provide for wider silicide formation on gate structure 14.

L-shaped spacers 18 can be silicon dioxide ($SiO_2$) structures which abut lateral side of gate structure 14. In an exemplary embodiment, L-shaped spacers are separated from gate structure 14 by oxide liner 16. Alternatively, other spacer materials, such as, silicon nitride ($Si_3N_4$), silicon oxide nitride (SiON), or other insulators can be used as L-shaped spacers 18. In an exemplary embodiment, L-shaped spacers 18 have an L-shape.

Advantageously, L-shaped spacers 18 provide several possibilities in device design. For instance, use of L-shaped spacers 18 allows for an additional buffer S/D extension that makes an improved tradeoff between series resistance and short-channel effects. A buffer extension is a junction between the deep S/D contact junction and the shallow S/D extension. The depth of the buffer extension is located between the two junctions. Advantageously, the buffer extension balances the requirements of a shallow junction (which is good for short-channel effect control) and deep contact junction (which is good for reducing series resistance).

Figure 2:
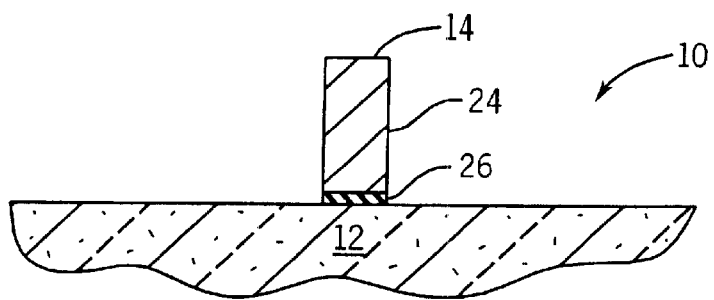
FIG. 2 is a schematic cross-sectional view representation of the portion of an integrated circuit of FIG. 1, illustrating a gate stack formation step in the integrated circuit fabrication process.

An exemplary method of forming portion 10 is described below with reference to FIGS. 1–5. The method advantageously forms portion 10 including L-shaped spacers 18. In FIG. 2, a cross-sectional view schematic of portion 10 illustrates a gate structure formation step. Gate structure 14 is formed over substrate 12 and may, for example, be from 1,000–3,000 Angstroms in thickness. Gate structure 14 can be fabricated utilizing any of a variety of different fabrication techniques. In an exemplary embodiment, gate structure 14 includes a gate electrode 24 and a gate oxide 26. Gate oxide 26 can include an oxide material and is located between gate electrode 24 and substrate 12. In an exemplary embodiment, gate structure 14 is formed by conventionally depositing a stack including layers for gate electrode 24 and gate oxide 26 and etching in a lithographic process. Gate oxide 26 is thermally grown to a thickness of 15–30 Angstroms.

Figure 3:
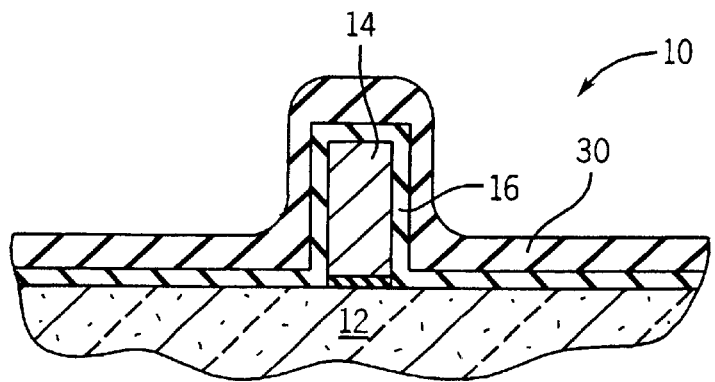
FIG. 3 is a schematic cross-sectional view representation of the portion of an integrated circuit of FIG. 1, illustrating a liner oxide deposition step and a nitride deposition step in the integrated circuit fabrication process.

In FIG. 3, a cross-sectional view schematic of portion 10 illustrates a deposition step. In an exemplary embodiment, oxide liner 16 is formed by a deposition of an oxide material having a thickness of 100–200 Angstroms. Any of a variety of deposition techniques may be employed, such as, a chemical vapor deposition (CVD) and plasma enhanced chemical vapor deposition (PECVD). After deposition of oxide liner 16, a nitride layer 30 is deposited. Nitride layer 30 can have a thickness of 250–400 Angstroms. Preferably, nitride layer 30 has a thickness which is thinner than the conventional deposited nitride layer, which has a typical thickness of 800–1,000 Angstroms. Nitride layer 30 can also be deposited using any of a variety of deposition techniques, such as, a chemical vapor deposition (CVD) and plasma enhanced chemical vapor deposition (PECVD). Applicant has found that the size of nitride layer 30 enables the advantageous formation of L-shaped spacers 18.

In FIG. 4, a cross-sectional view schematic of portion 10 illustrates a dummy oxide spacer formation step. Dummy oxide spacers 33 are formed by depositing an oxide layer over nitride layer 30. In an exemplary embodiment, the deposited oxide layer has a thickness of 500–1,000 Angstroms. The deposited oxide layer is etched to form dummy oxide spacers 33. Any of a variety of etching techniques may be employed, such as, plasma etching. In an exemplary embodiment, dummy oxide spacers 33 can have a width of 20–40 nanometers (nm).

In FIG. 5, a cross-sectional view schematic of portion 10 illustrates an etching step. In an exemplary embodiment, portions of nitride layer 30 and oxide liner 16 are etched in the areas unprotected or not covered by dummy oxide spacers 33. Any of a variety of etching techniques may be employed to etch away portions of nitride layer 30 and oxide liner 16, such as, plasma etching.

Referring again to FIG. 1, dummy oxide spacers 33 are removed. In an exemplary embodiment, dummy oxide spacers 33 are removed by time-controlled wet etching. Additionally, gaps 19 and 21 are portions of oxide liner 16 along gate structure 14 which are also removed. Gaps 19 and 21 extend to a depth which is substantially the same as the height of dummy oxide spacers 33.

While the embodiments illustrated in the FIGURES and described above are presently preferred, it should be understood that these embodiments are offered by way of example only. Other embodiment s may include, for example, different techniques for depositing spacer material and different removal techniques. The invention is not limited to a particular embodiment, but extends to various modifications, combinations, and permutations that nevertheless fall within the scope and spirit of the appended claims.

What is claimed is:

1. A method of forming L-shaped spacers in an integrated circuit, the method comprising:
   providing a gate structure over a semiconductor substrate;
   providing an oxide liner adjacent lateral sides of the gate structure;
   depositing a spacer material over the oxide liner;
   forming dummy oxide spacer structures over the spacer material, the dummy oxide spacer structures having a shape to selectively cover an L-shaped portion of the spacer material;
   removing portions of the spacer material not covered by the dummy oxide spacer structures; and
   removing a portion of the oxide liner intermediate the spacer material and the gate structure.

2. The method of claim 1, further comprising removing the dummy oxide spacers.

3. The method of claim 1, wherein the spacer material comprises nitride.

4. The method of claim 1, wherein the step of removing the dummy oxide spacer structures step comprises time-control wet etching.

5. The method of claim 1, wherein the dummy oxide spacer structures have a width of between 20 and 40 nm.

6. The method of claim 1, wherein the spacer material is deposited having a thickness of between 250 and 400 Angstroms.

7. The method of claim 1, wherein the step of removing portions of the spacer material comprises applying a plasma etch.

8. A method of forming L-shaped spacers in an integrated circuit, the method comprising:

forming a gate structure on a substrate;

depositing a liner oxide layer over the substrate and the gate structure;

depositing a nitride layer over the liner oxide layer;

forming dummy oxide spacer structures over the nitride layer where the nitride layer is located proximate lateral side walls of the gate structure;

removing portions of the nitride layer and liner oxide layer not covered by the dummy oxide spacer structures; and removing a portion of the liner oxide layer between the gate structure and the nitride layer.

9. The method of claim 8, further comprising removing dummy oxide spacer structures.

10. The method of claim 8, wherein the nitride layer has a thickness of between 250 and 400 Angstroms.

11. The method of claim 8, further comprising forming a buffer source/drain extension.

12. The method of claim 8, wherein the liner oxide layer has a thickness of between 100 and 200 Angstroms.

13. The method of claim 8, wherein the step of depositing a nitride layer comprises depositing a nitride material to form a conformal layer over the substrate and the gate structure.

14. A method of fabricating an integrated circuit, the method comprising:

depositing an oxide liner over a semiconductor substrate and a gate structure disposed over the semiconductor substrate;

depositing a layer of spacer material over the oxide liner;

providing dummy spacer structures over first portions of the layer of spacer material, the first portions having an L-shape and located proximate lateral side walls of the gate structure;

removing second portions of the layer of spacer material, the second portions being uncovered by the dummy spacer structures; and forming a gap between the gate structure and the spacer material by removing a portion of the oxide liner.

15. The method of claim 14, wherein the layer of spacer material includes nitride and has a thickness of 250–400 Angstroms.

16. The method of claim 14, further comprising removing the dummy spacer structures.

17. The method of claim 16, wherein the oxide layer has a thickness of 100–200 Angstroms.

18. The method of claim 14, wherein the step of removing the dummy spacer structures comprises applying a time-controlled wet etching process.

19. The method of claim 18, wherein the step of removing the dummy spacer structures comprises removing a portion of an oxide layer abutting lateral side walls of the gate structure.

20. The method of claim 14, wherein the dummy spacer structures have widths of 20–40 nm.

* * * * *